United States Patent
Busta et al.

(10) Patent No.: US 6,929,983 B2
(45) Date of Patent: Aug. 16, 2005

(54) METHOD OF FORMING A CURRENT CONTROLLING DEVICE

(75) Inventors: Heinz H. Busta, Park Ridge, IL (US); J. Scott Steckenrider, Plainfield, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 12 days.

(21) Appl. No.: 10/675,417

(22) Filed: Sep. 30, 2003

(65) Prior Publication Data

US 2005/0067612 A1 Mar. 31, 2005

(51) Int. Cl.⁷ .................... H01L 21/335; H01L 21/8232
(52) U.S. Cl. .................. 438/142; 438/100; 438/147; 438/263
(58) Field of Search ............................. 438/100, 101, 438/128, 142, 147, 263, 264, 692, 197; 977/DIG. 1

(56) References Cited

U.S. PATENT DOCUMENTS

| | | | |
|---|---|---|---|
| 4,789,648 A | 12/1988 | Chow et al. | |
| 4,956,313 A | 9/1990 | Cote et al. | |
| 5,106,778 A | * 4/1992 | Hollis et al. | 438/173 |
| 5,137,544 A | 8/1992 | Medellin | |
| 5,157,876 A | 10/1992 | Medellin | |
| 5,209,816 A | 5/1993 | Yu et al. | |
| 5,244,523 A | 9/1993 | Tollini | |
| 5,340,370 A | 8/1994 | Cadien et al. | |
| 5,354,490 A | 10/1994 | Yu et al. | |
| 5,391,258 A | 2/1995 | Brancaleoni et al. | |
| 5,476,606 A | 12/1995 | Brancaleoni et al. | |
| 5,527,423 A | 6/1996 | Neville et al. | |
| 5,753,938 A | * 5/1998 | Thapar et al. | 257/77 |
| 5,783,489 A | 7/1998 | Kaufman et al. | |
| 5,954,997 A | 9/1999 | Kaufman et al. | |
| 5,993,686 A | 11/1999 | Streinz et al. | |
| 6,015,506 A | 1/2000 | Streinz et al. | |
| 6,033,596 A | 3/2000 | Kaufman et al. | |
| 6,039,891 A | 3/2000 | Kaufman et al. | |
| 6,054,733 A | * 4/2000 | Doan et al. | 257/315 |
| 6,063,306 A | 5/2000 | Kaufman et al. | |
| 6,068,787 A | 5/2000 | Grumbine et al. | |
| 6,121,143 A | 9/2000 | Messner et al. | |
| 6,128,214 A | 10/2000 | Kuekes et al. | |
| 6,256,767 B1 | 7/2001 | Kuekes et al. | |
| 6,605,840 B1 | * 8/2003 | Wu | 257/315 |
| 6,759,730 B2 | * 7/2004 | Chaudhry et al. | 257/586 |

\* cited by examiner

Primary Examiner—Amir Zarabian
Assistant Examiner—Khanh Duong
(74) Attorney, Agent, or Firm—Edward Runyan; Blair Hughes

(57) ABSTRACT

A current-controlling device comprising a first conductor, a second conductor, and a tunneling barrier comprising a first insulating layer between the first conductor and the second conductor. The tunneling barrier electrically isolates the first conductor from the second conductor. At least one mobile charge is positionable within the tunneling barrier. The device also includes a gate, wherein a voltage applied to the gate with respect to the substrate (or with respect to a second gate formed on or in the substrate) modulates or moves the mobile charge to a position between the first conductor and the second conductor within the tunneling barrier, thus deforming the shape of the energy barrier between the first conductor and the second conductor. The deformation can cause a current to flow between the conductors when a voltage is present between them due to quantum mechanical tunneling.

10 Claims, 4 Drawing Sheets

METHOD OF FORMING A CURRENT CONTROLLING DEVICE

BACKGROUND

I. Field of the Invention

The present invention is generally directed to a current controlling device and, more particularly, to a device that controls the flow of current by the position of a mobile charge within an insulating tunneling barrier.

II. Description of Related Technology

Currently, there is a great deal of interest in the development of single electron transistors, single molecule transistors, and in electronic devices created using nanotechnology to create electronic devices (such as memory circuits) with dimensions in the nanometer range. Nanoscale technology may increase the speed or circuit density of the next generation of integrated circuits.

A recent example of a nanotechnology electronic device is Hewlett-Packard's "Molecular Wire Crossbar Memory", disclosed in U.S. Pat. No. 6,128,214. This memory device uses a two-dimensional array of a large number of nanometer-scale devices, each located at the junction of crossed nanometer-scale "wires". The "devices" are bi-stable molecules such as rotaxane, pseudo-rotaxane, or catenane, and they are switchable between two states when voltage is applied to the pair of wires that create the junction. The state of one of these bi-stable molecules can be read non-destructively with a "read" voltage.

However, electrically active molecules often cannot withstand temperatures that are commonly reached during integrated circuit processing, hence the need for extremely fault-tolerant architectures. For example, one touted feature of Hewlett-Packard's Teramac custom computer that uses a nanowire grid connected by a monolayer of molecular switches was its ability to function correctly even though thousands of individual cells of its Field-Programmable Gate Arrays were defective to some extent.

Thus, a nanoscale current controlling device that uses standard thin-film and integrated circuit fabrication techniques could make possible improved integration into high-density memory arrays and other circuits.

SUMMARY

According to an exemplary embodiment, a current-controlling device may be formed on a substrate. The device includes a first conductor, a second conductor, and a tunneling barrier, the tunneling barrier comprising a first insulation layer. The tunneling barrier electrically isolates the first conductor from the second conductor. At least one mobile charge is positionable within the tunneling barrier.

The device also includes a gate, wherein a voltage applied to the gate with respect to the substrate modulates or moves the mobile charge to a position between the first conductor and the second conductor within the tunneling barrier, thus deforming the shape of the barrier between the first conductor and the second conductor. The resulting deformation causes current to flow between the conductors when there is a voltage between the conductors.

According to another exemplary embodiment, a method of fabricating a current-controlling device on a substrate is provided. The method comprises forming a first insulating layer on the substrate and then creating a first conductor on the first insulating layer. Next, the first conductor is shaped to form a first tunneling contact area. A second insulating layer is then formed on the surface of the first conductor. A second conductor is created on the first and second insulating layers and is then shaped to form a second tunneling contact area.

In the next step, the first conductor, the second insulating layer, and the second conductor are planarized to form a single planarized surface and a tunneling barrier between the first tunneling contact area and the second tunneling contact area, the tunneling barrier comprising the second insulating layer.

A third insulating layer is then formed on the single planarized surface, and at least one mobile charge is introduced within at least one of the insulating layers, the mobile charge positionable within the tunneling barrier. Finally, a gate contact is created on the third insulating layer.

These as well as other aspects of applicant's present arrangements will become apparent to those of ordinary skill in the art by reading the following detailed description, with appropriate reference to the accompanying drawings.

BRIEF DESCRIPTION OF THE DRAWINGS

Exemplary arrangements are described herein with reference to the drawings, in which.

DETAILED DESCRIPTION

1. Overview

Figure 1:
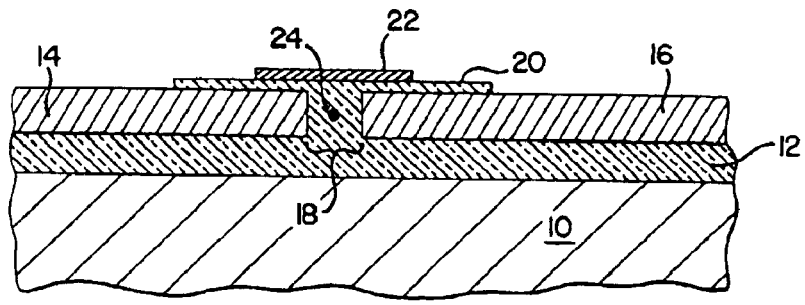
FIG. 1 illustrates a cross-section of one embodiment of a current control device.

FIG. 1 is a cross-sectional view of one possible embodiment of a nanoscale current control device in accordance with the present invention. As discussed above, such a device may find use in a memory or other switching or logic circuit.

The device may be referred to as "nanoscale" because its feature size is measurable in nanometers. The device represents a breakthrough in production because it can be fabricated using standard thin-film and Integrated Circuit (IC) processing techniques, even though nanoscale devices usually require highly specialized processing, like nanotechnology-scale lithography.

The device may be formed on a substrate 10, which may be a silicon wafer, upon which is an insulating layer 12, which may be an oxide insulator such as silicon dioxide. Two conductors 14 and 16 are positioned above layer 12, and they are separated by a tunneling barrier 18, which is simply a gap between tunneling contact areas of conductors 14 and 16. Tunneling barrier 18 may be an insulator such as silicon dioxide. The tunneling barrier 18 acts as an insulator to limit tunneling current between the conductors in the "off" mode.

A gate insulation layer 20 may be positioned above the conductors and the tunneling barrier, and may also be made of silicon dioxide or another suitable insulator. As will become clear from the method of making the current control device, it is not necessary that any of the layers comprise any particular material, or even the same material, since the layers are formed in distinct stages that would allow different materials to be used to suit any number of desired processing or performance characteristics.

A final layer comprises a gate 22 above gate insulation layer 20. A mobile charge 24 may be positioned within the tunneling barrier 18 or in another part of the device to change or control the current between the conductors 14 and 16.

2. Processing

Figure 2:
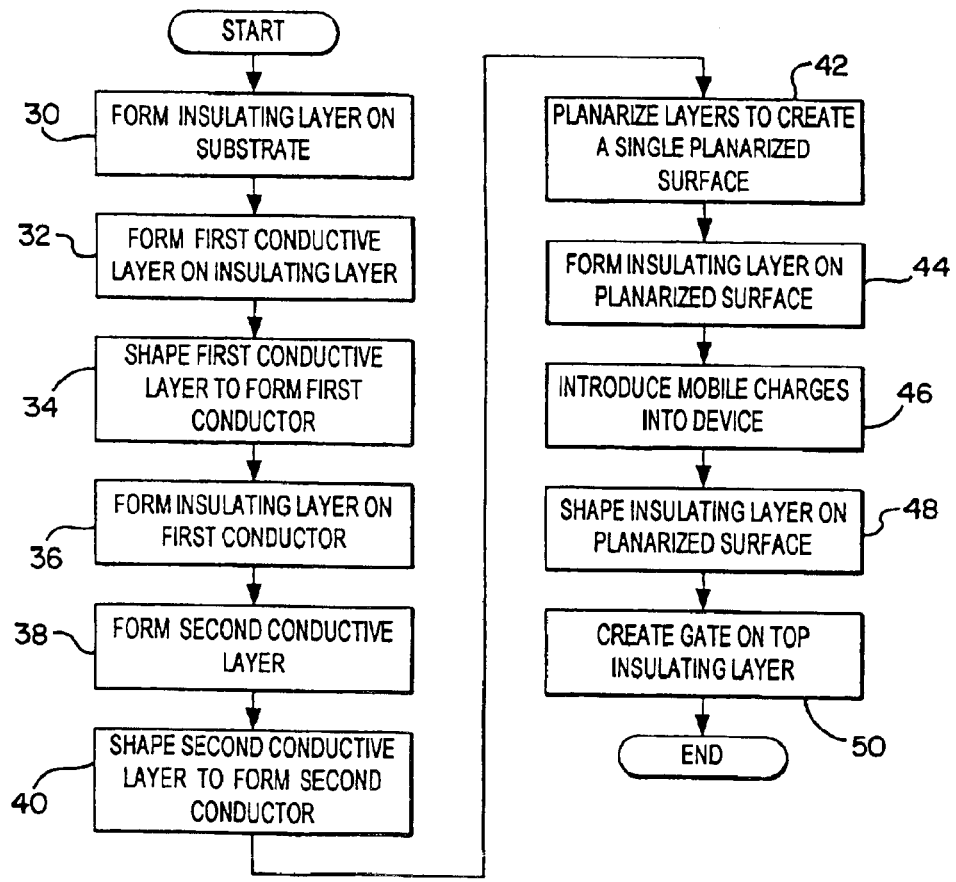
FIG. 2 is a flow chart identifying processing steps that may be used for fabricating the device illustrated in FIG. 1.

FIG. 2 illustrates a set of steps that may be used to fabricate a current control device in accordance with the present invention. First, as shown at step 30, the insulating layer 12, such as silicon dioxide, is deposited or grown on a silicon substrate 10, which may be a polished silicon wafer. The insulating layer may be several nanometers thick, or thicker. This is followed (at step 32) by the deposition of about 100–300 nm of polycrystalline silicon.

Figure 3A:
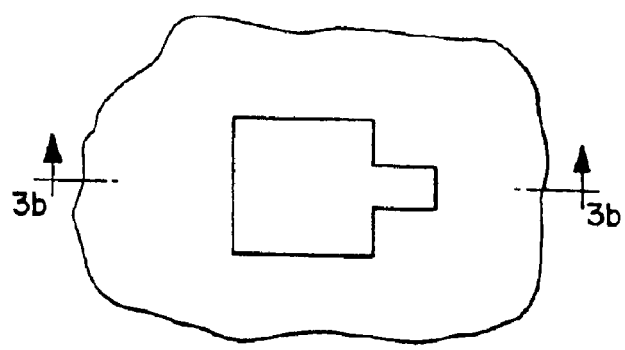
FIG. 3 illustrates the device of FIG. 1 following formation and shaping of a first conductor.
Figure 3B:
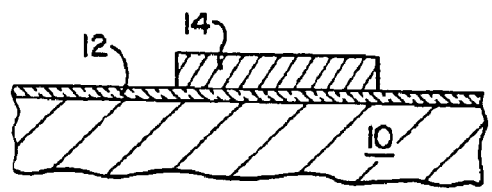

This layer may be deposited using low-pressure chemical vapor deposition (LPCVD) at about 500° C. The layer can be doped as n- type or p-type silicon by ion implantation of phosphorous or boron, for example, to form a conductive layer. The conductive layer is then shaped using photolithography, and is thus etched down to layer 12 to create conductor 14 that includes a tunneling contact area, as shown at step 34. As just one example, the polycrystalline silicon layer can be etched using sulfur hexafluoride ($SF_6$) plasma etching. As is well known in the art, any remaining photoresist can be stripped from conductor 14 and the assembly may be cleaned. FIG. 3a illustrates a top view and FIG. 3b illustrates a cross-sectional view of the device at this step.

Figure 4:
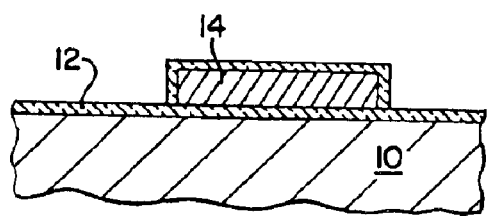
FIG. 4 illustrates the device of FIG. 1 following formation of an insulating layer on the first conductor.

Next, as shown at step 36, conductor 14 may be oxidized to form a second insulating layer using any suitable technique, such as dry oxidation at about 700° C. to 900° C., at which temperature any implanted ions in conductor 14 may become activated. It is also possible to anneal conductor 14 at other temperatures for ion activation, either before or after step 36. For example, depending on the sheet resistivity desired, conductor 14 could be annealed at about 600° C. to 1000° C. for 15 to 30 minutes to activate the dopants, or for several seconds if rapid thermal processing is used. The time and temperature used may be optimized for different dopant species and any other factors. The second insulating layer may be between about 2 nm and 10 nm thick. FIG. 4 illustrates a cross-section of the result after step 36.

Figure 5:
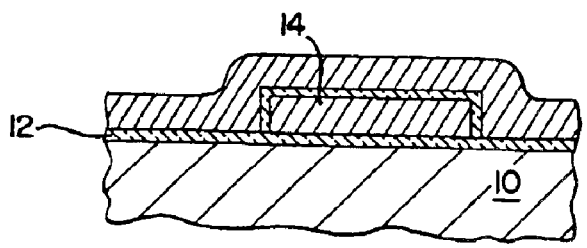
FIG. 5 illustrates the device of FIG. 1 following formation of a second conductive layer.

Next, at step 38, a second layer (about 100–300 nm thick) of polycrystalline silicon may be deposited over the previously formed surfaces. This layer may be formed and processed using any of the techniques described above with regard to the first layer. FIG. 5 is a cross-sectional view of the device as it would appear following step 38.

Figure 6A:
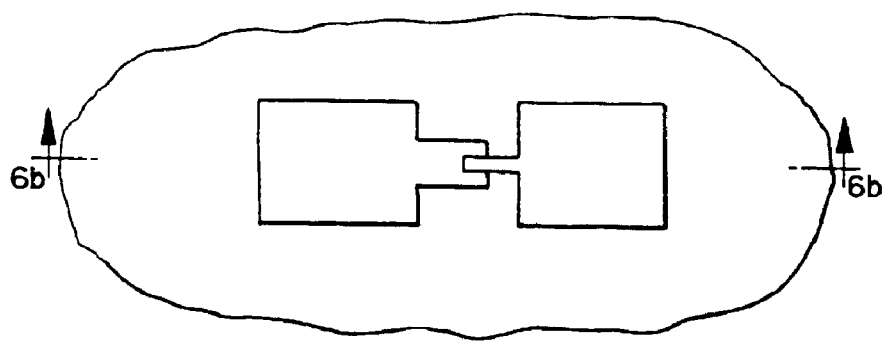
FIG. 6 illustrates the device of FIG. 1 following shaping of the second conductive layer.
Figure 6B:
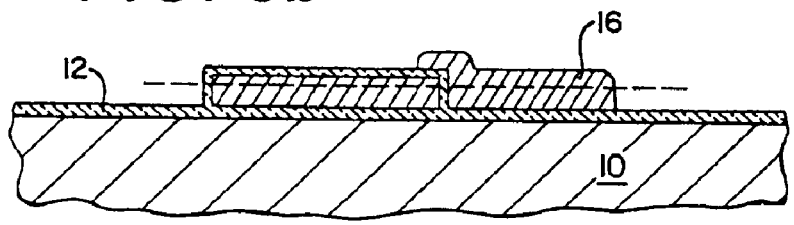

The second conductive layer is also shaped using photolithography and etched (i.e., photoshaped) down to layer 12 to create the conductor 16 that includes a tunneling contact area that is adjacent the tunneling contact area of conductor 14, as shown at step 40. FIG. 6a illustrates a top view, and FIG. 6b illustrates a cross-sectional view, of the device at this step. Either conductor may be narrower than the other in order to control the width of tunneling barrier 18 while allowing for a greater margin of placement error during processing. The tunneling barrier width, defined by the width of the narrowest conductor's tunneling contact area, could be about one micron or less.

Conductors 14 and 16 may be made of suitable conductive materials other than doped silicon, such as metal. The only requirement is that the conductors are capable of being accurately shaped on the insulating layer 12. Furthermore, instead of oxidizing conductor 14 to form the tunneling barrier, a thin layer of insulation may be deposited by any other suitable means.

Next, as shown at step 42, conductors 14 and 16 as well as the second insulating layer are planarized to the level shown by the dotted line in FIG. 6b. The planarization process used may be a Chemical Mechanical Planarization ("CMP") process or any other suitable planarization process.

One aspect of the process of this invention is the use of polishing techniques, and preferably CMP, to controllably remove material to create a single planarized surface. Any procedures that are known to those of skill in the art for controllably removing materials from a surface of a substrate may be utilized in this invention. It is preferred that polishing processes are used. The polishing process can be hand polishing or mechanical polishing. The polishing processes can utilize a polishing substrate such as a cloth or a polishing pad used alone or in conjunction with a liquid or aqueous polishing composition. It is most preferred that chemical mechanical polishing techniques are used to remove at least one material, material layer, or portion of a layer from the substrate during the process of this invention.

In a typical chemical mechanical polishing (CMP) process, the substrate surface that is being polished is placed into contact with a rotating polishing pad. A carrier applies pressure against the backside of the substrate. During the polishing process, the pad and table are rotated while a downward force is maintained against the substrate's back. A polishing composition is applied to the interface between the polishing pad and the substrate's surface that is to be polished.

Examples of CMP polishing methods, compositions and slurries are disclosed in U.S. Pat. Nos. 6,121,143, 6,068,787, 6,063,306, 6,033,596, 6,039,891, 6,015,506, 5,954,997, 5,993,686, 5,783,489, 5,244,523, 5,209,816, 5,340,370, 4,789,648, 5,391,258, 5,476,606, 5,527,423, 5,354,490, 5,157,876, 5,137,544, 4,956,313, the specifications of each of which are incorporated herein by reference.

Figure 7A:
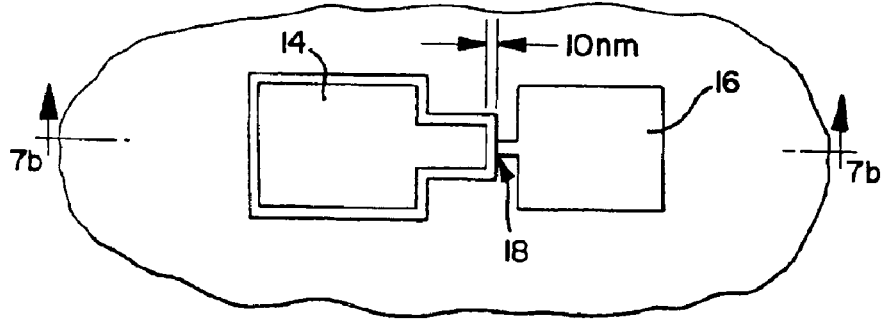
FIG. 7 illustrates the device of FIG. 1 following planarization of the first and second conductors and the insulating layer.
Figure 7B:
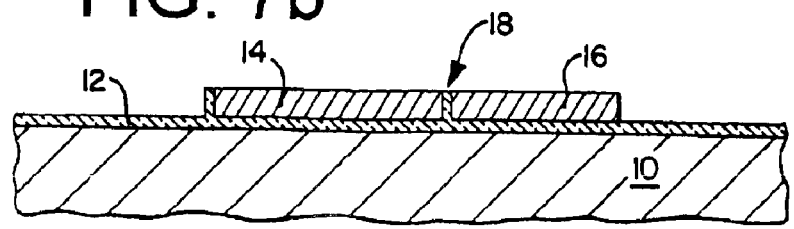

Planarization of the device at the processing stage shown in FIG. 6b results in the device shown in FIGS. 7a and 7b. Note that the planarization of multiple layers to produce a single planarized surface creates the nanoscale tunneling barrier 18 without resorting to any specialized lithographic procedures. Instead, the (very small) length of the tunneling barrier is dependent on the thickness of an insulation layer that may be created any number of ways on the first conductor 14. The tunneling barrier may be several nanometers wide or greater, and could ordinarily be about 10 nm wide.

Next, a third insulation layer 20, such as silicon dioxide, can be deposited or grown on the single planarized surface, as shown at step 44. As with previous insulating layers, any suitable method may be used, such as LPCVD or plasma assisted oxide deposition. At this stage, mobile charges could be introduced to the device, as shown at step 46. The mobile charges can be introduced anywhere that enables them to move to the tunneling barrier 18 under proper conditions; thus, they may have been introduced earlier during any oxide formation step. If the insulating layer into which mobile charges are introduced is silicon dioxide, sodium ions can be used as the mobile charges since they have good mobility in silicon dioxide, especially at elevated operating temperatures (e.g., 100° C.–200° C.). Other ions such as potassium and lithium could also be used. Mobile ions could be diffused during oxide formation or added by implantation.

If the tunneling barrier has a length of 10 nm and a width of 1 micron, the channel area (i.e., length times width) is $1\times10^{-10} cm^2$. For an ion density of $1\times10^{10}$ to $1\times10^{12}$ ions/$cm^2$, this corresponds to 1 to 100 ions per device. A higher doping dose can be used if more ions are needed. The third insulating layer may be photoshaped as shown at step 48.

After the third insulation layer has been created, the gate material (such as, without limitation, doped polycrystalline silicon, tungsten, chromium, tantalum, or aluminum) can be deposited over the tunneling barrier and photoshaped to create the gate 22, as shown at step 50. The result after this step is the device shown in FIG. 1. While only one device is shown, persons of ordinary skill in the art will recognize that the process described here is equally suitable for creating a large number of interconnected current control devices on a single substrate using standard IC technology.

The conductive substrate itself acts as a bottom gate, but where multiple devices are formed on a single substrate, a separate bottom gate for each device can be fabricated as an array of conductive lines as will be understood by those of ordinary skill in the art. For example, one or more "bottom" gates could be formed under each device by etching channels or lines into the substrate, depositing or otherwise forming conductive material onto an adhesion layer in the channels, and planarizing the substrate using CMP. Then, the steps described above could be performed to create individual devices over each bottom gate.

3. Device Operation

Figure 8:
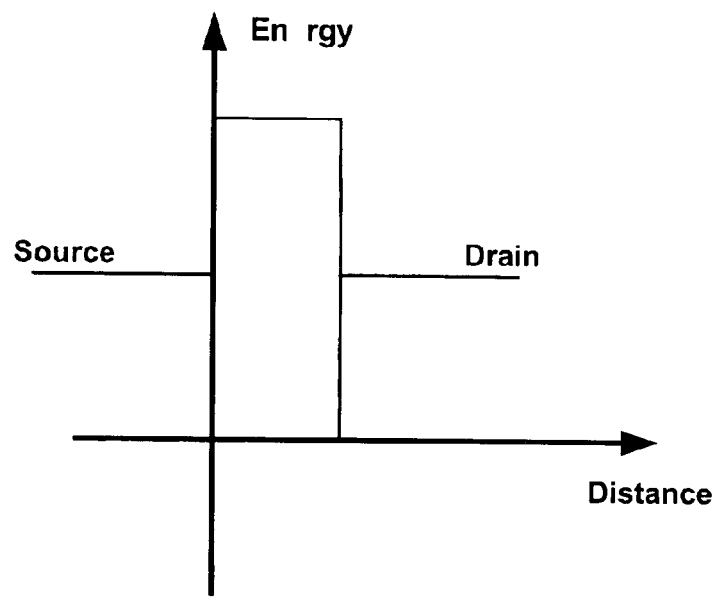
FIG. 8 is a diagram that represents the shape of the energy barrier between the two conductors of the device.

FIG. 8 is a diagram that illustrates the shape of the energy barrier between the two conductors of the device, which can be referred to as a source and a drain although they are not necessarily analogous in all aspects to the source and drain of different types of devices (such as Field Effect Transistors (FETs)). FIG. 8 illustrates the energy barrier electrons must overcome between the source and the drain of the device with very little or no bias voltage applied between the gate and the substrate. If the barrier is thin enough, electrons can then "tunnel" through the barrier with the resultant current depending on the thickness of the barrier and the barrier height. This tunneling is known as quantum mechanical tunneling. Under the appropriate gate biasing condition, any mobile charges in the device will either be very near the gate or the substrate, and away from the tunneling barrier. Accordingly, little or no source-drain current will flow since the barrier length was chosen to achieve this condition with the appropriate gate and source-drain bias conditions.

Figure 9:
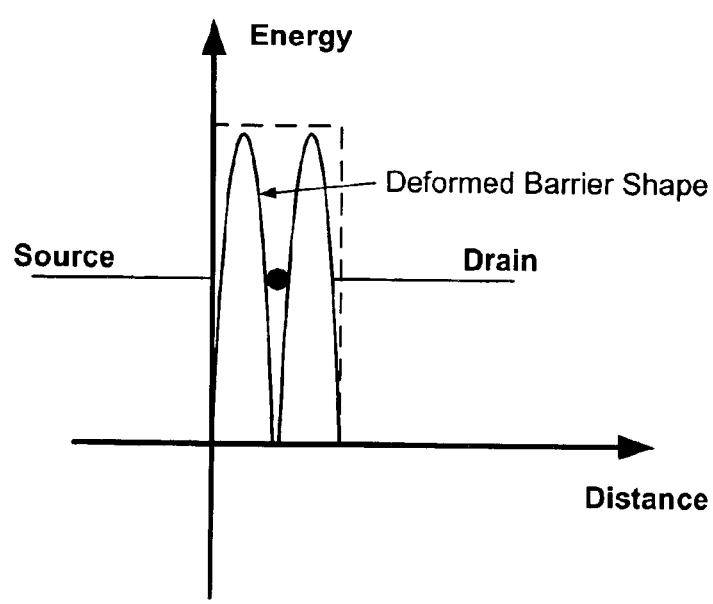
FIG. 9 is a diagram that represents the shape of the energy barrier between the two conductors of the device with a mobile charge positioned between two conductors.

When the mobile charges of the device are positioned between the tunneling contacts of the source and the drain, however (i.e., within the tunneling barrier), the energy diagram of the tunneling barrier is deformed as shown in FIG. 9. Since the tunneling current is dependent on the shape of the energy diagram, the current through the device can be modulated by the position of any mobile charge present in the device. The largest current results when the mobile charge(s) are in or near the center of the tunneling barrier, as shown in FIG. 1.

The quantum mechanical tunneling probability of an electron tunneling through a barrier is proportional to:

$$e^{-\int f(\Phi(x))dx}$$

where $f(\Phi(x))$ is a function of $\Phi(x)$ with $\Phi$=the value of the energy barrier at a distance x. Since $\int f(\Phi(x))dx|_{ion\ in\ barrier} < \int f(\Phi(x))dx|_{no\ ion\ in\ barrier}$, the tunneling probability (and thus the current flow) is greater when a mobile charge is within the tunneling barrier.

If the device is used as a memory element, a "zero" would result when the mobile charge is at the gate or substrate, and a "one" results when the mobile charge is positioned at or near the center of the tunneling barrier, between the substrate and the gate. An appropriate bias voltage between the substrate and the gate will cause the mobile charge to move to a position between (or cycle between) the source and the drain. Such an appropriate bias could be, for example, a slowly varying DC voltage with a superimposed low-frequency AC voltage to reduce the effects of positional drift of the mobile charge.

Exemplary embodiments of the present invention have been described. Those skilled in the art will understand, however, that changes and modifications may be made to these embodiments without departing from the scope of the present invention, which is defined by the claims.

What is claimed is:

1. A method of forming a current-controlling device on a substrate, the method comprising:
   forming a first insulating layer on the substrate;
   creating a first conductor on the first insulating layer;
   shaping the first conductor to form a first tunneling contact area;
   forming a second insulating layer on the surface of the first conductor;
   creating a second conductor on the first and second insulating layers;
   shaping the second conductor to form a second tunneling contact area;

planarizing the first conductor, the second insulating layer, and the second conductor to form a single planarized surface and a tunneling barrier between the first tunneling contact area and the second tunneling contact area, the tunneling barrier comprising the second insulating layer;

forming a third insulating layer on the single planarized surface;

introducing at least one mobile charge within at least one of the insulating layers, the mobile charge positionable within the tunneling barrier; and creating a gate contact on the third insulating layer.

2. The method of claim 1, wherein the first insulating layer comprises silicon dioxide.

3. The method of claim 1, wherein all the insulating layers comprise silicon dioxide.

4. The method of claim 1, wherein the first conductor comprises n-type or p-type silicon.

5. The method of claim 1, wherein the planarizing step comprises Chemical Mechanical Planarization.

6. The method of claim 1, further comprising implanting the at least one mobile charge in an insulating layer.

7. The method of claim 1, further comprising diffusing the at least one mobile charge in an insulating layer.

8. The method of claim 1, wherein the at least one mobile charge comprises between 1 and about 100 ions.

9. The method of claim 1, wherein the tunneling gap is about 10 nanometers wide.

10. A method of forming a current-controlling device on a substrate, the method comprising:

forming a first insulating layer on the substrate;

creating a first layer of doped polycrystalline silicon on the first insulating layer, the first layer of doped polycrystalline silicon comprising n-type or p-type silicon;

shaping the first layer of doped polycrystalline silicon to form a first tunneling contact area;

forming a first silicon dioxide layer on the exposed surface of the first layer of doped polycrystalline silicon, the first silicon dioxide layer comprising between one and about 100 mobile ions;

creating a second layer of doped polycrystalline silicon on the first insulating layer and on the first silicon dioxide layer, the second layer of doped polycrystalline silicon comprising n-type or p-type silicon;

shaping the second layer of doped polycrystalline silicon to form a second tunneling contact area;

planarizing, by Chemical Mechanical Planarization, the first layer of doped polycrystalline silicon, the second insulating layer, and the second layer of doped polycrystalline silicon to form a tunneling gap between the first tunneling contact area and the second tunneling contact area, the gap comprising the first silicon dioxide layer and the mobile ions, the tunneling gap being between about 5 nanometers and about 15 nanometers wide;

forming a second silicon dioxide layer on the planarized surface; and creating a gate contact layer on the third insulating layer.

* * * * *